(12) United States Patent
Chang et al.

(10) Patent No.: US 10,037,952 B2
(45) Date of Patent: Jul. 31, 2018

(54) INTEGRATED CIRCUIT, ELECTRONIC DEVICE AND METHOD FOR TRANSMITTING DATA IN ELECTRONIC DEVICE

(71) Applicant: MEDIATEK INC., Hsin-Chu (TW)

(72) Inventors: Chun-Wei Chang, Taipei (TW); Shang-Pin Chen, Zhubei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/408,683

(22) Filed: Jan. 18, 2017

(65) Prior Publication Data
US 2017/0125363 A1 May 4, 2017

Related U.S. Application Data

(63) Continuation-in-part of application No. 14/997,048, filed on Jan. 15, 2016.
(Continued)

(51) Int. Cl.
*H05K 1/02* (2006.01)
*H01L 23/66* (2006.01)
(Continued)

(52) U.S. Cl.
CPC .......... *H01L 23/66* (2013.01); *G06F 13/4072* (2013.01); *H01L 23/5386* (2013.01);
(Continued)

(58) Field of Classification Search
None
See application file for complete search history.

(56) References Cited

U.S. PATENT DOCUMENTS 5,838,412 A * 11/1998 Ueda .................... G02B 6/0088
349/150
8,203,395 B2 6/2012 Guo et al.
(Continued)

FOREIGN PATENT DOCUMENTS

| CN | 103513818 A | 1/2014 |
| TW | 200539525 A | 12/2005 |
| TW | 201437877 A | 10/2014 |

OTHER PUBLICATIONS

"Programmable Coplanar Flexible Circuit;" IBM Technical Disclosure Bulletin; vol. 32; No. 7; Dec. 1989; pp. 426-427.

*Primary Examiner* — Courtney Smith
*Assistant Examiner* — Jessey R Ervin
(74) *Attorney, Agent, or Firm* — Wolf, Greenfield & Sacks, P.C.

(57) ABSTRACT

An integrated circuit is provided. The integrated circuit includes a control circuitry, a plurality of pins coupled to a plurality of conductive traces of a printed circuit board (PCB), and a plurality of driving units coupled to the pins. The control circuitry provides a plurality of control signals according to data to be transmitted. The driving units are divided into a plurality of first driving units and second driving units. According to the control signals, the first driving units provide the data to a memory device of the PCB via the corresponding pins and the corresponding conductive traces of PCB, and the second driving units provide a constant voltage to the corresponding conductive traces of PCB via the corresponding pins. The conductive traces corresponding to the second driving units are separated by the conductive traces corresponding to the first driving units on the PCB.

20 Claims, 14 Drawing Sheets

Related U.S. Application Data

(60) Provisional application No. 62/289,376, filed on Feb. 1, 2016, provisional application No. 62/114,266, filed on Feb. 10, 2015.

(51) Int. Cl.
| | | |
|---|---|---|
| *H01L 25/065* | (2006.01) | |
| *H05K 1/18* | (2006.01) | |
| *H01L 23/538* | (2006.01) | |
| *H01L 23/552* | (2006.01) | |
| *G06F 13/40* | (2006.01) | |
| *H01L 27/12* | (2006.01) | |
| *H04B 3/32* | (2006.01) | |
| *H01L 23/00* | (2006.01) | |
| *H05K 3/46* | (2006.01) | |

(52) U.S. Cl.
CPC ........ *H01L 23/552* (2013.01); *H01L 25/0655* (2013.01); *H01L 27/12* (2013.01); *H04B 3/32* (2013.01); *H05K 1/0218* (2013.01); *H05K 1/0219* (2013.01); *H05K 1/181* (2013.01); *H01L 24/16* (2013.01); *H01L 2223/6688* (2013.01); *H01L 2224/16227* (2013.01); *H01L 2924/14* (2013.01); *H01L 2924/15192* (2013.01); *H01L 2924/3025* (2013.01); *H05K 1/0216* (2013.01); *H05K 1/0243* (2013.01); *H05K 3/46* (2013.01); *H05K 2201/09972* (2013.01); *H05K 2201/10159* (2013.01); *H05K 2201/10318* (2013.01); *H05K 2201/10522* (2013.01)

(56) References Cited

U.S. PATENT DOCUMENTS

| | | |
|---|---|---|
| 9,299,508 B2 | 3/2016 | Ding et al. |
| 9,330,218 B1 * | 5/2016 | Chiu .................... G11C 29/022 |
| 2004/0174807 A1 * | 9/2004 | Li ............................ H04B 3/34 |
| | | 370/201 |
| 2005/0221677 A1 | 10/2005 | Hammond, Jr. et al. |
| 2008/0304352 A1 * | 12/2008 | Chen ................... G06F 13/1694 |
| | | 365/230.02 |
| 2010/0233908 A1 * | 9/2010 | Tseng ..................... H01R 27/00 |
| | | 439/620.21 |
| 2012/0269522 A1 * | 10/2012 | Kagaya ................... H01P 3/026 |
| | | 398/183 |
| 2013/0128646 A1 * | 5/2013 | Nishihara ............. H01L 23/367 |
| | | 363/141 |
| 2013/0220690 A1 | 8/2013 | Chang et al. |

\* cited by examiner

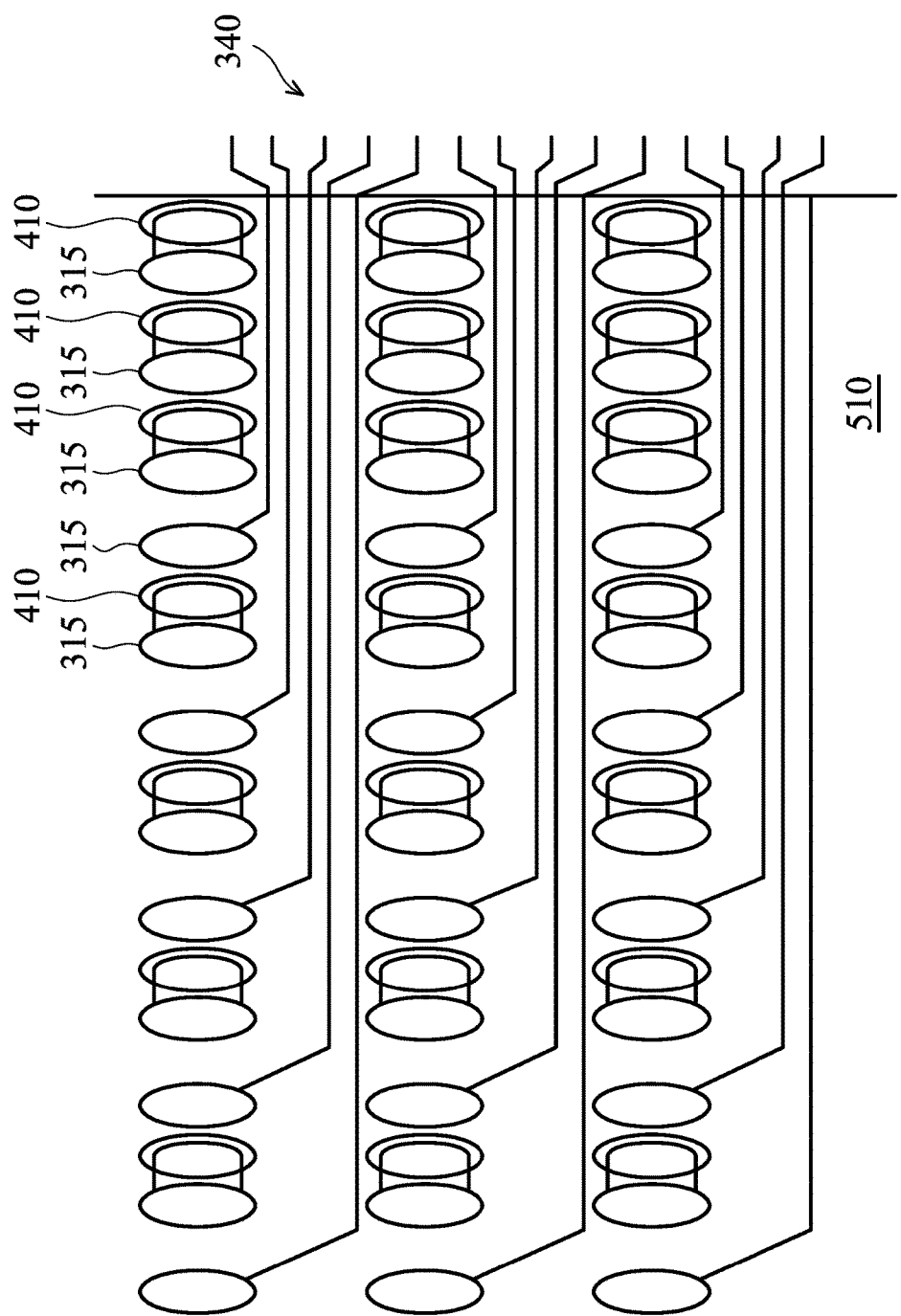

INTEGRATED CIRCUIT, ELECTRONIC DEVICE AND METHOD FOR TRANSMITTING DATA IN ELECTRONIC DEVICE

CROSS REFERENCE TO RELATED APPLICATIONS

This application claims the benefit of U.S. Provisional Application No. 62/289,376, filed on Feb. 1, 2016, and is a Continuation-In-Part of U.S. patent application Ser. No. 14/997,048, filed on Jan. 15, 2016 and entitled "INTEGRATED CIRCUIT, ELECTRONIC DEVICE AND METHOD FOR TRANSMITTING DATA IN ELECTRONIC DEVICE", which claims the benefit of U.S. Provisional Application No. 62/114,266, filed on Feb. 10, 2015, the entirety of which are incorporated by reference herein.

BACKGROUND OF THE INVENTION

Field of the Invention

The invention relates to an electronic device, and more particularly to guard traces of a printed circuit board (PCB) in an electronic device arranged by a chip on the PCB.

Description of the Related Art

In electronic devices, printed circuit boards (PCBs) are used to mechanically support and electrically connect electronic components using conductive pathways, conductive traces (e.g. signal traces or ground traces) etched from metal sheets laminated onto a non-conductive core substrate. In recent years, an increased amount of input/output (I/O) connections for multi-functional or memory chips has been required for semiconductor chip package design. The impact of this will be pressure on printed circuit board (PCB) fabricators to minimize the width and the space of the conductive traces, or increase the number of layers on the PCB. The conductive traces used to transmit the signals corresponding to the same function need to be arranged and configured in the same manner on the PCB. For example, the conductive traces used to transmit the address/data bus of a memory need to be arranged and configured in parallel, and the spaces between the conductive traces are also small. However, the adjacent conductive traces on the PCB can result in the problem of crosstalk, especially in high signal speed applications. Thus, the crosstalk problem can detrimentally affect the quality of a signal traveling on a conductive trace, thereby affecting the signal reception of the electronic component supported by the PCB.

Therefore, it is desirable to optimize the arrangement of the conductive traces for avoiding the crosstalk problem on a PCB of an electronic device.

BRIEF SUMMARY OF THE INVENTION

An integrated circuit, an electronic device, and a method for transmitting data from a first chip to a second chip via a plurality of conductive traces of a printed circuit board (PCB) in an electronic device are provided. An embodiment of an integrated circuit is provided. The integrated circuit comprises a control circuitry, a plurality of pins coupled to a plurality of conductive traces of a printed circuit board (PCB), and a plurality of driving units coupled to the conductive traces of the PCB via the pins. The control circuitry provides a plurality of control signals according to data to be transmitted. The driving units are divided into a plurality of first driving units and a plurality of second driving units. According to the control signals, the first driving units provide the data to a memory device of the PCB via the corresponding pins and the corresponding conductive traces of PCB, and the second driving units provide at least one constant voltage to the corresponding conductive traces of PCB via the corresponding pins. The conductive traces corresponding to the second driving units are separated by the conductive traces corresponding to the first driving units on the PCB.

Moreover, another embodiment of an integrated circuit is provided. The integrated circuit comprises a control circuitry, a plurality of pins coupled to a plurality of conductive traces of a printed circuit board (PCB), and a plurality of driving units coupled to the conductive traces of the PCB via the corresponding pins. The control circuitry provides a plurality of control signals according to data to be transmitted and pin information regarding a memory device of the PCB. When the pin information indicates that the memory device is a first memory, the control signals control the driving units to provide the data to the conductive traces of PCB via the pins. When the pin information indicates that the memory device is a second memory, the control signals control a portion of the driving units to provide the data to the corresponding conductive traces of PCB via the corresponding pins, and the control signals control the other driving units to provide at least one constant voltage to the corresponding conductive traces of PCB via the corresponding pins. A pin number of the first memory is greater than a pin number of the second memory.

Furthermore, an embodiment of an electronic device is provided. The electronic device comprises a printed circuit board (PCB), a first chip mounted on the PCB, and a second chip mounted on the PCB. The PCB comprises a plurality of conductive traces, wherein the conductive traces are divided into a plurality of first conductive traces and a plurality of second conductive traces. The second chip is coupled to the first chip via the first conductive traces. The first chip comprises a plurality of pins coupled to the first and second conductive traces of the PCB, a control circuitry, and a plurality of driving units coupled to the pins. The control circuitry provides a plurality of control signals according to data to be transmitted to the second chip. The control signals control the driving units coupled to the pins corresponding to the first conductive traces of the PCB to provide the data to the second chip, and control the driving units coupled to the pins corresponding to the second conductive traces of the PCB to provide at least one constant voltage to the PCB.

Moreover, an embodiment of method for transmitting data from a first chip to a second chip via a plurality of first conductive traces of a printed circuit board (PCB) in an electronic device is provided, wherein the first chip and the second chip are mounted on the PCB. The first chip provides a plurality of control signals are provided according to the data to be transmitted to the second chip and pin information regarding the second chip. The first chip controls a plurality of first driving units to provide the data to the second chip via the first conductive traces of the PCB. The first chip controls a plurality of second driving units to provide at least one constant voltage to the PCB via a plurality of second conductive traces of the PCB. The first conductive traces are electrically connected to the second chip on the PCB, and the second conductive traces are electrically separated from the second chip on the PCB. Each of the second conductive traces is surrounded by the first conductive traces on the PCB.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 4A shows a layout of a first layer on the PCB of FIG. 3;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
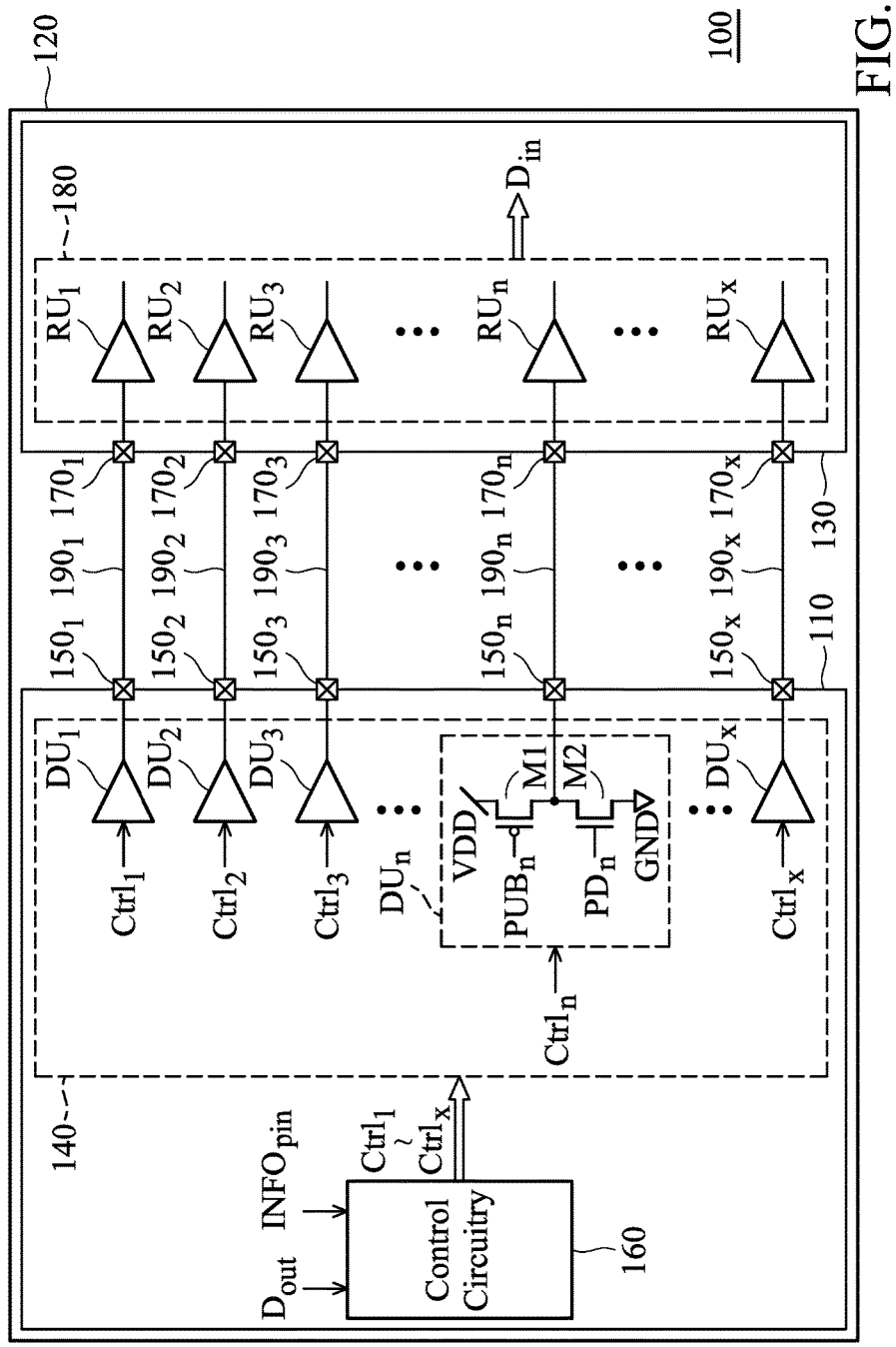
FIG. 1 shows an electronic device according to an embodiment of the invention.

FIG. 1 shows an electronic device 100 according to an embodiment of the invention. The electronic device 100 comprises a first chip 110, a printed circuit board (PCB) 120, and a second chip 130, wherein the first chip 110 and the second chip 130 are mounted on the PCB 120. The first chip 110 is a controller capable of accessing different types of memory devices. In the embodiment, the first chip 110 is operating in a normal mode, and the pin information $INFO_{pin}$ indicates that the second chip 130 is a double data rate type III (DDR3) memory. In the normal mode, the first chip 110 can transmit data with a single data rate to the second chip 130 via a plurality of conductive traces $190_1$-$190_x$ of the PCB 120. The first chip 110 comprises an output module 140, a plurality of pins $150_1$-$150_x$, and a control circuitry 160. The control circuitry receives data $D_{out}$ to be provided to the second chip 130 and pin information $INFO_{pin}$ regarding the pin configuration of the second chip 130, and provides a plurality of control signals $Ctrl_1$-$Ctrl_x$ to the second chip 130 according to the data $D_{out}$ and the pin information $INFO_{pin}$. In some embodiments, the data $D_{out}$ and the pin information $INFO_{pin}$ are obtained from a circuit (e.g. a memory, a processor or other functional circuitry) of the first chip 110 or a device outside the first chip 110. The output module 140 comprises a plurality of driving units $DU_1$-$DU_x$, wherein an output of each driving unit is coupled to the corresponding pin of the first chip 110. For example, the output of the driving unit $DU_1$ is coupled to the pin $150_1$ of the first chip 110, and the output of the driving unit $DU_2$ is coupled to the pin $150_2$ of the first chip 110, and so on. In the embodiment, each of the driving units $DU_1$-$DU_x$ has the same circuitry and structure. Taking the driving unit $DU_n$ as an example, the driving unit $DU_n$ comprises a PMOS transistor M1 and an NMOS transistor M2. The PMOS transistor M1 is coupled between a power supply VDD and the pin $150_n$, and the PMOS transistor M1 is controlled by a signal $PUB_n$ corresponding to the control signal $Ctrl_n$. The NMOS transistor M2 is coupled between the pin $150_n$ and a ground GND, and the NMOS transistor M2 is controlled by a signal $PD_n$ opposite to the signal $PUB_n$. In the embodiment, according to the control signal $Ctrl_n$, the driving unit $DU_n$ can provide 1-bit data of the data $D_{out}$ to the second chip 130 via the conductive trace $190_n$ of the PCB 120. In some embodiments, the PMOS transistor M1 is formed by a plurality of PMOS transistors connected in parallel, and the NMOS transistor M2 is formed by a plurality of NMOS transistors connected in parallel.

In FIG. 1, the second chip 130 comprises an input module 180 and a plurality of pins $170_1$-$170_x$, wherein the input module 180 comprises a plurality of receiving unit $RU_1$-$RU_x$. Each of the receiving units $RU_1$-$RU_x$ is coupled to the corresponding conductive trace of the PCB 120 via the corresponding pin of the second chip 130, and is used to receive a signal transmitted in the corresponding conductive trace. For example, the receiving unit $RU_1$ is coupled to the conductive trace $190_1$ of the PCB 120 via the pin $170_1$ of the second chip 130, and the receiving unit $RU_2$ is coupled to the conductive trace $190_2$ of the PCB 120 via the pin $170_2$ of the second chip 130, and so on. After receiving the signals, the input module 180 is capable of provide an input data $D_{in}$ according to the received signals for subsequent processing.

In some embodiments, the first chip 110 is capable of providing the data $D_{out}$ with a first transmission rate R1 in the normal mode and with a second transmission rate R2 in the high-speed mode, wherein the second transmission rate R2 is higher than the first transmission rate R1. In some embodiments, the second transmission rate R2 is twice the first transmission rate R1. Due to the second transmission rate R2 is higher than the first transmission rate R1, the number of transmitted bits per second in the high-speed mode is more than the number of transmitted bits per second in the normal mode, thereby the first chip 110 can use fewer the driving units and the corresponding conductive traces of PCB to transmit the data $D_{out}$. For example, if the first chip 110 is operating in a normal mode, all of the driving units $DU_1$-$DU_x$ are used to provide the data $D_{out}$. If the first chip 110 is operating in a high-speed mode, according to the control signal $Ctrl_1$-$Ctrl_x$, a portion of driving units are selected from the driving units $DU_1$-$DU_x$ to provide the data $D_{out}$, and the remaining driving units (i.e. the unselected driving units) are used to provide at least one specific shielding pattern to form the guard traces GT for the signal traces ST corresponding to the selected driving units. The specific shielding pattern is formed by a ground signal, a power signal or a random signal. For the second chip 130, the shielding pattern is invalid data, thus the second chip 130 will ignore the shielding pattern. The arrangement of the guard traces and the signal traces will be described below.

Figure 2A:
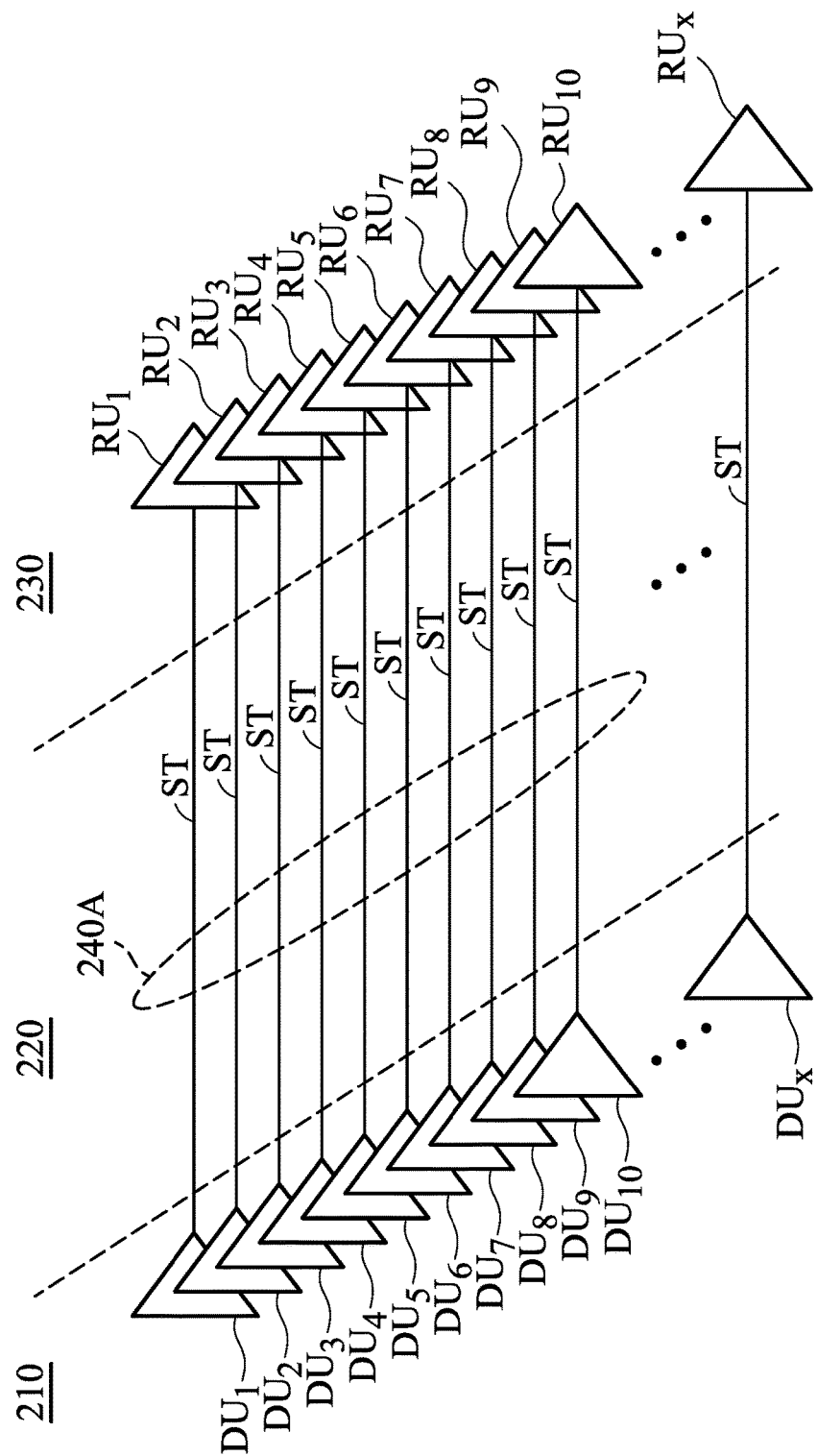
FIG. 2A shows an example illustrating the arrangement of a plurality of conductive traces between a first chip and a second chip on a PCB according to an embodiment of the invention.

FIG. 2A shows an example illustrating the arrangement of a plurality of conductive traces 240A between a first chip 210 and a second chip 230 on a PCB 220 according to an embodiment of the invention. In order to simplify the description, the pins of the first chip 210 and the second chip 230 will be omitted in FIG. 2A. In the embodiment, the first chip 210 is operating in a normal mode, and the conductive traces 240A are disposed on the same layer of the PCB 220, e.g. a top layer of the PCB 220. As described above, all driving units $DU_1$-$DU_x$ of the first chip 210 are used to provide the data $D_{out}$ in the normal mode, thereby all of the conductive traces 240A function as the signal traces ST for transmitting the data $D_{out}$ to the second chip 230.

Figure 2B:
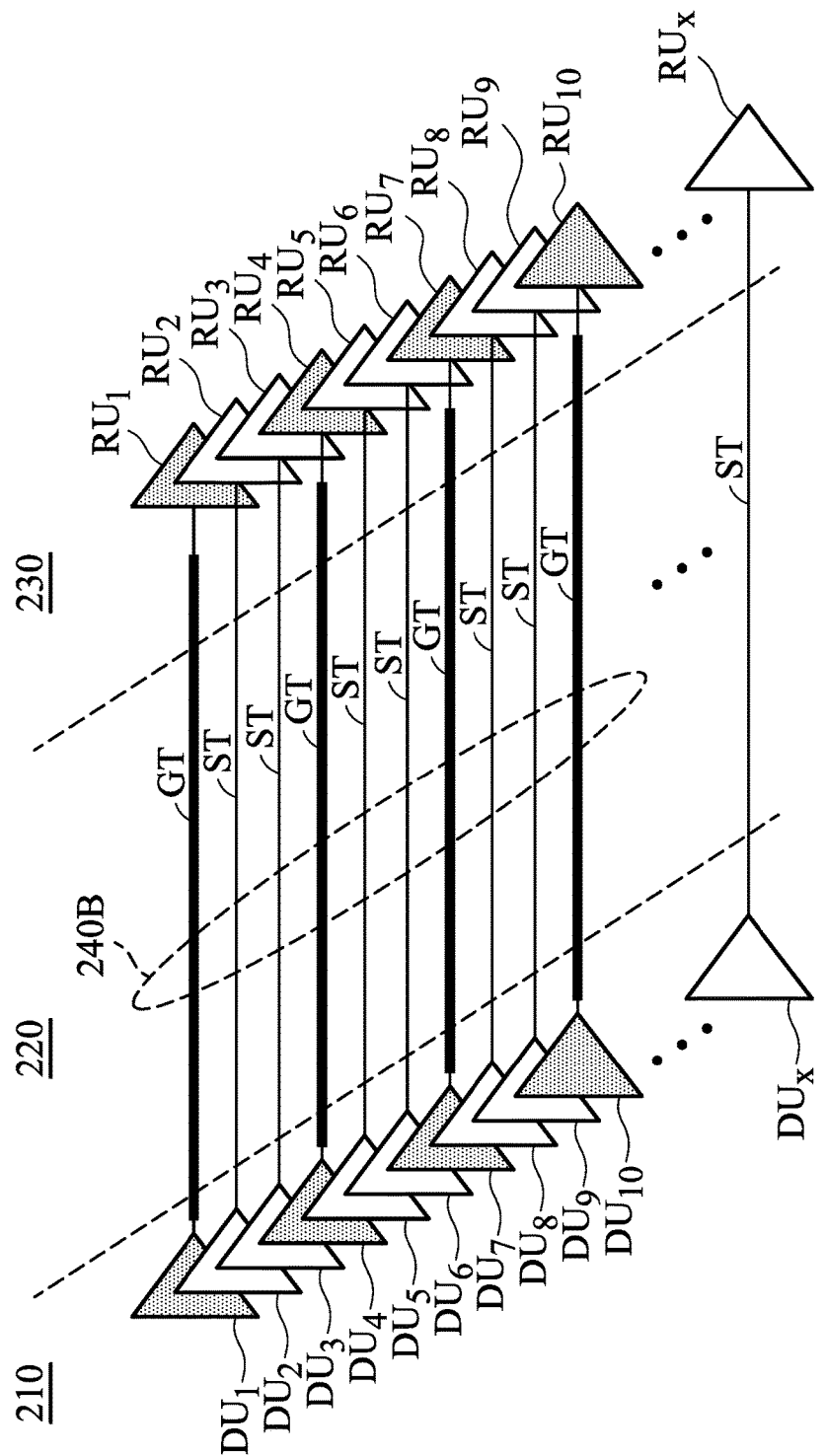
FIG. 2B shows an example illustrating the arrangement of a plurality of conductive traces between the first chip and the second chip on the PCB according to another embodiment of the invention.

FIG. 2B shows an example illustrating the arrangement of a plurality of conductive traces 240B between the first chip 210 and the second chip 230 on the PCB 220 according to another embodiment of the invention. In order to simplify the description, the pins of the first chip 210 and the second chip 230 will be omitted in FIG. 2B. In the embodiment, the first chip 210 is operating in a high-speed mode, and the conductive traces 240B are disposed on the same layer of the PCB 220, e.g. the top layer of the PCB 220. As described above, a portion of driving units are selected from the driving units $DU_1$-$DU_x$ to provide the data $D_{out}$ in the high-speed mode, i.e. not all of the driving units $DU_1$-$DU_x$ are used to provide the data $D_{out}$. Furthermore, the unselected driving units are used to provide at least one shielding pattern. The specific shielding pattern is formed by a ground signal, a power signal or a random signal. For example, the driving units $DU_2$-$DU_3$, $DU_5$-$DU_6$, $DU_8$-$DU_9$ are selected to provide the data $D_{out}$, thereby the conductive traces 240B corresponding to the selected driving units function as the signal traces ST for transmitting the data $D_{out}$ to the second chip 230. Moreover, the unselected driving units $DU_1$, $DU_3$, $DU_7$ and $DU_{10}$ are used to provide at least one shielding pattern, thereby the conductive traces 240B corresponding to the unselected driving units function as the guard traces GT for reducing crosstalk when the data $D_{out}$ is transmitted via the signal traces ST. It should be noted that the guard traces GT are separated by the signal traces ST in FIG. 2B. Furthermore, the shielding pattern transmitted by each guard trace GT can be the same or different. It should be noted that the number of guard traces GT is less than the number of signal traces ST in FIG. 2B.

Traditionally, after obtaining system specification and requisition, a plurality of shielding lines are implemented on a PCB in order to decrease crosstalk problem, wherein the shielding lines are fixedly routed on the PCB and are also inserted into the conductive traces between the devices on the PCB. In general, the shielding lines are coupled to a ground of the PCB. Compared with the traditional shielding lines, the guard traces GT of FIG. 2B will not occupy the additional area on the PCB 220, i.e. the guard traces GT are the unused signal traces existing on the PCB 220, i.e. the unused signal traces ST will be used as the guard traces GT. Specifically, no additional shielding line is fixedly routed and inserted into the conductive traces 240B on the PCB 220, thus decreasing layout size of the PCB 220. Furthermore, the arrangement of the conductive traces 240B is determined according to the outputs of the driving units $DU_1$-$DU_x$ of the first chip 210, wherein the outputs of the driving units $DU_1$-$DU_x$ are controlled by a control circuitry of the first chip 210, e.g. the control circuitry 160 of FIG. 1, according to the data $D_{out}$. The control circuitry of the first chip 210 can modify the arrangement of the conductive traces 240B via the driving units $DU_1$-$DU_x$ according to actual applications. Furthermore, the guard traces can reduce electrical noise from affecting the signals between the first chip 210 and the second chip 230, e.g. avoiding the signal current loops formed in the conductive traces 240B on the PCB 220. In traditional design flows, a shielding design is passively planned according to system specifications in advance. In the embodiment, the interconnection between the first chip 210 and the second chip 230 can be planned in advance, and the layout of signals of the interconnection can be minimized before the system specifications are confirmed. Next, according to the speed of the system specifications, the shielding pattern is modified, thereby obtaining the best electrical performances. Furthermore, the development cost in the layout is also decreased.

Figure 3:
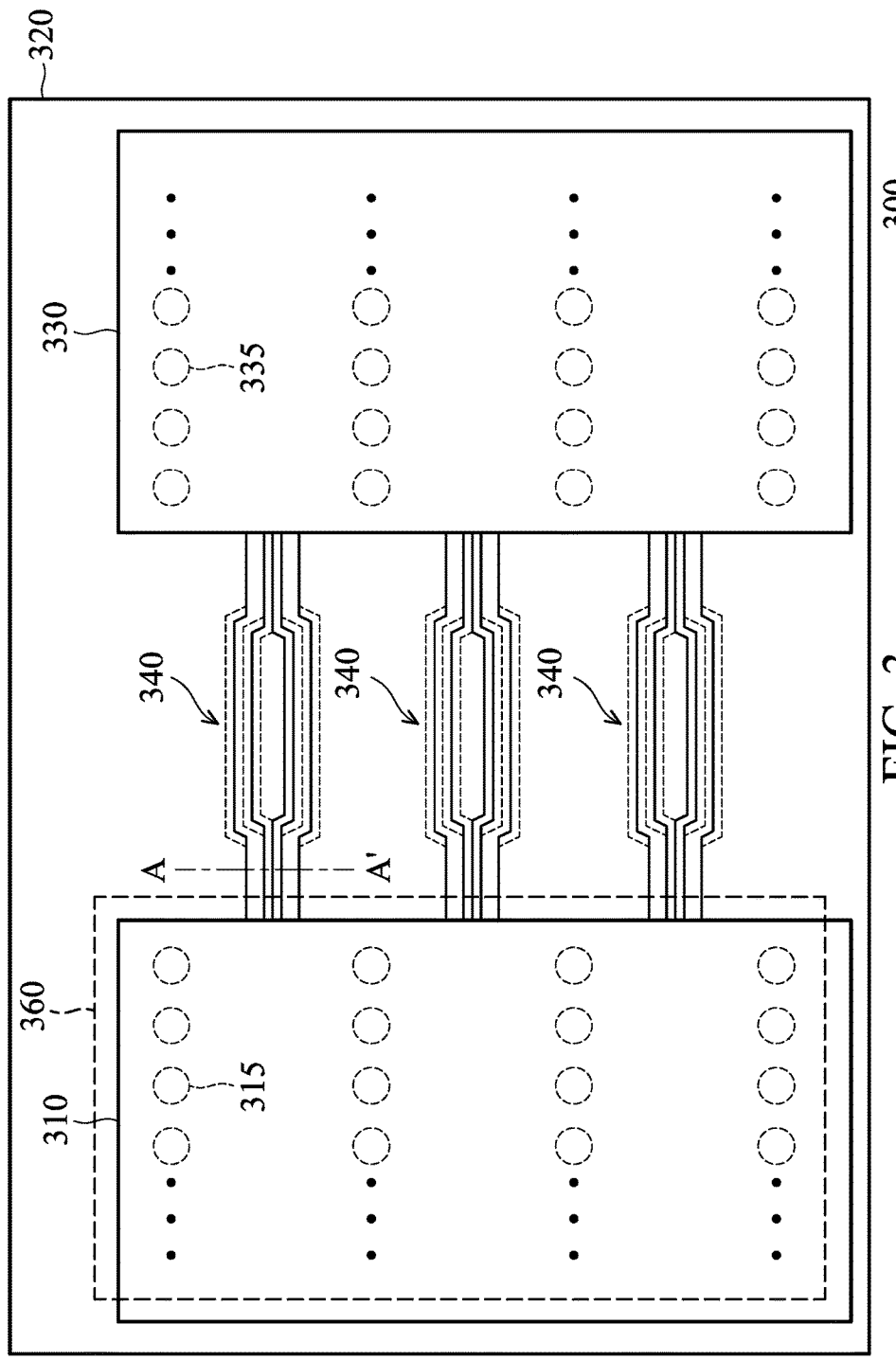
FIG. 3 shows an example illustrating a top view of an electronic device according to another embodiment of the invention.

FIG. 3 shows an example illustrating a top view of an electronic device 300 according to another embodiment of the invention. The electronic device 300 comprises a first chip 310, a PCB 320, a second chip 330, and a plurality of conductive traces 340 between the first chip 310 and the second chip 330. By using a flip chip technology, the first chip 310 is bonded on the PCB 320 via a plurality of bumps 315, and the second chip 330 is bonded on the PCB 320 via a plurality of bumps 335. Furthermore, the first chip 310 comprises a plurality of driving units (e.g. the driving units $DU_1$-$DU_x$ of FIG. 1) for transmitting data $D_{out}$ to the second chip 330, wherein each driving unit is coupled to the individual conductive trace 340 via the corresponding bump 315. As described above, all of the driving units of the first chip 310 are used to provide the data $D_{out}$ with a first transmission rate R1 in a normal mode. Furthermore, a portion of driving units are selected to provide the data $D_{out}$ with a second transmission rate R2 in a high-speed mode, and the remainder of the driving units are used to provide at least one specific shielding pattern in the high-speed mode, wherein the second transmission rate R2 is higher than the first transmission rate R1. In the embodiment, the conductive traces 340 are disposed on different layers of the PCB 320, and coupled between the bumps 315 of the first chip 310 and the bumps 335 of the second chip 330. The example layout range (labeled as 360) of the bumps 315 of the first chip 310 and the conductive traces 340 are described in FIGS. 4A-4C.

Figure 4B:
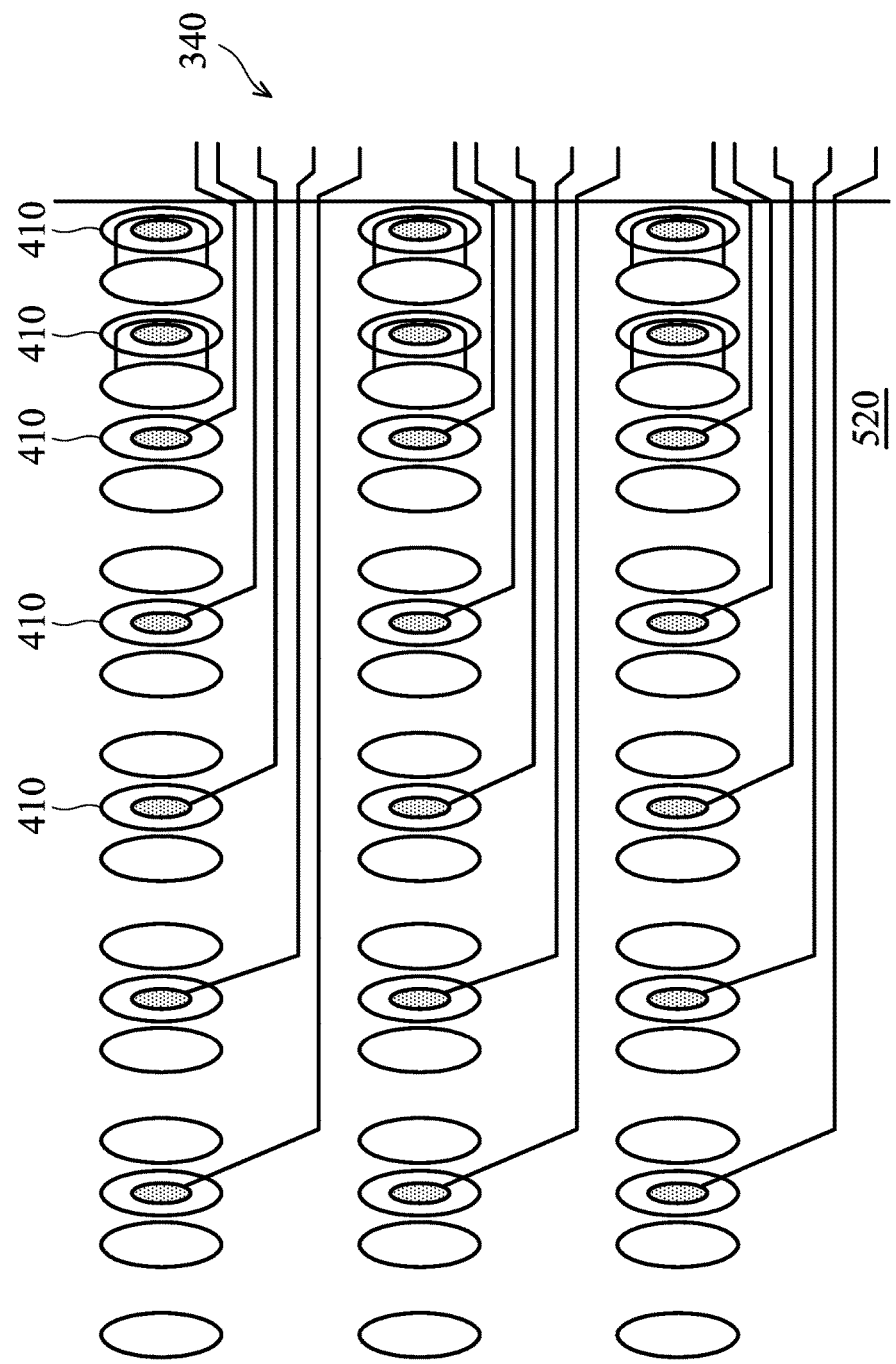
FIG. 4B shows a layout of a second layer below the first layer on the PCB of FIG. 3.
Figure 4C:
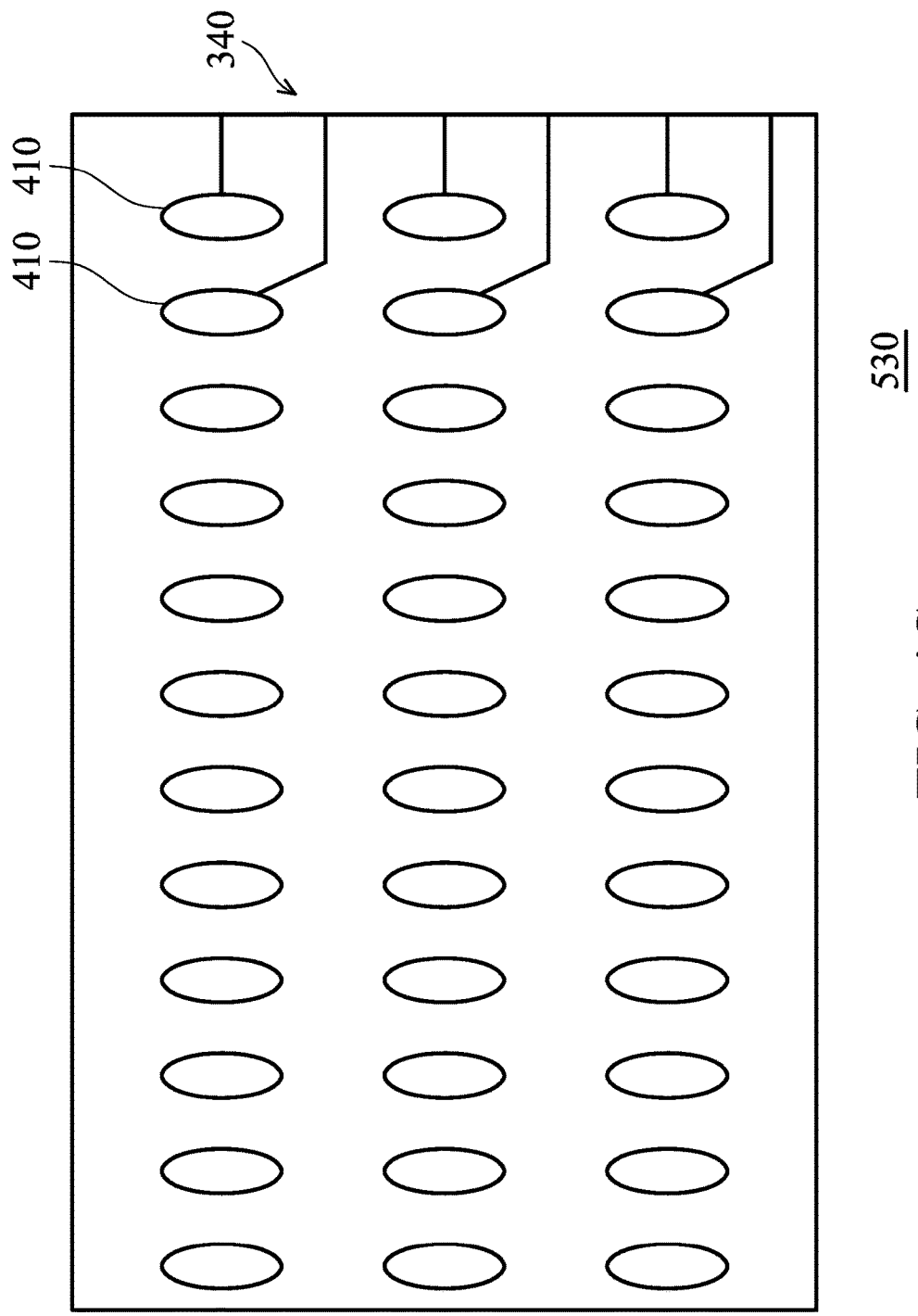
FIG. 4C shows a layout of a third layer below the second layer on the PCB of FIG. 3.

FIG. 4A shows a layout of a first layer 510 (e.g. a top layer) on the PCB 320 of FIG. 3, FIG. 4B shows a layout of a second layer 520 below the first layer 510 on the PCB 320 of FIG. 3, and FIG. 4C shows a layout of a third layer 530 below the second layer 520 on the PCB 320 of FIG. 3. Referring to FIG. 3 and FIGS. 4A-4C together, the conductive traces 340 are coupled to the first chip 310 via the bumps 315 of the first chip 310 and a plurality of vias 410 of the PCB 320.

Figure 5A:
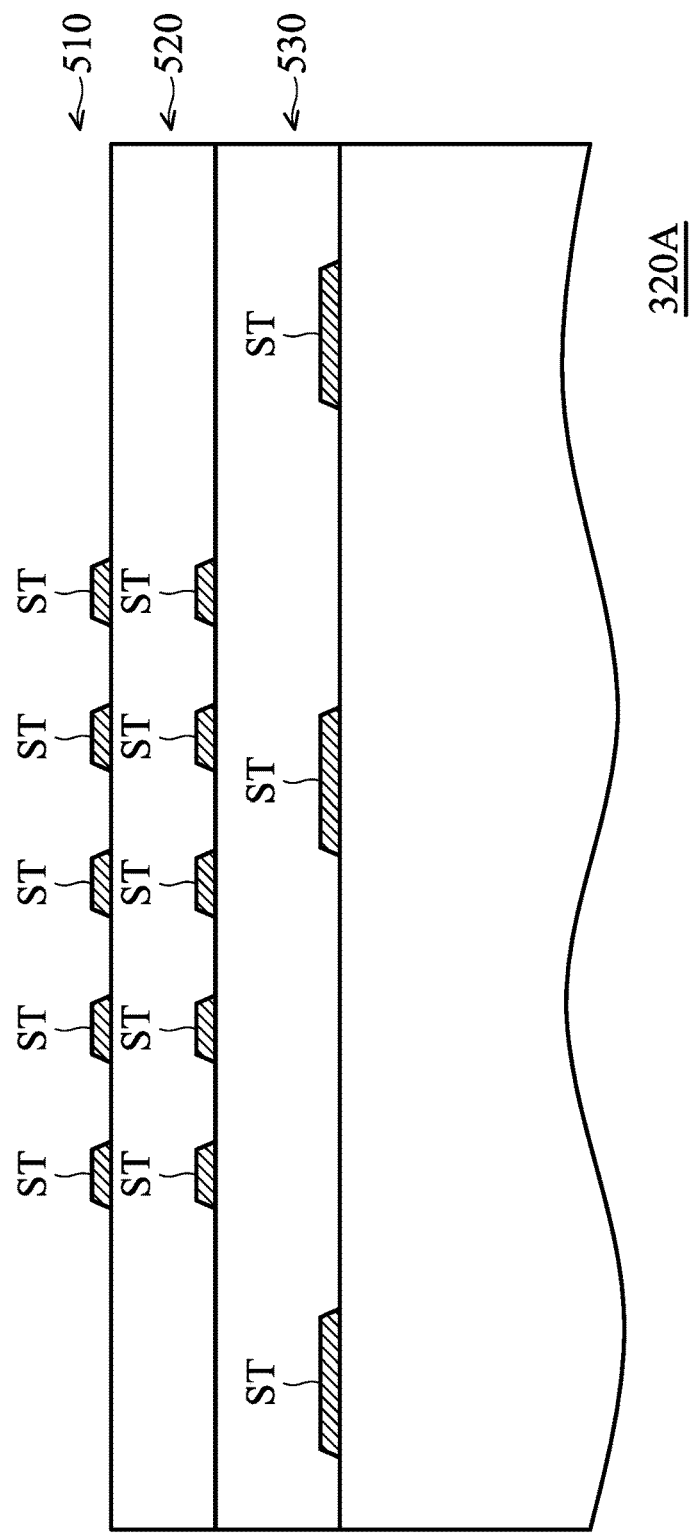
FIG. 5A shows a cross section illustrating the arrangement of the conductive traces of an exemplary PCB along line A-A' of FIG. 3 according to an embodiment of the invention.

FIG. 5A shows a cross section illustrating the arrangement of the conductive traces 340 of an exemplary PCB 320A along line A-A' of FIG. 3 according to an embodiment of the invention. Referring to FIG. 3 and FIG. 5A together, in the embodiment, the first chip 310 is operating in a normal mode. As described above, all driving units of the first chip 310 are used to provide the data $D_{out}$ in the normal mode, thereby all of the conductive traces 340 disposed on the first layer 510, the second layer 520 and the third layer 530 of the PCB 320A function as the signal traces ST for transmitting the data $D_{out}$ to the second chip 330.

Figure 5B:
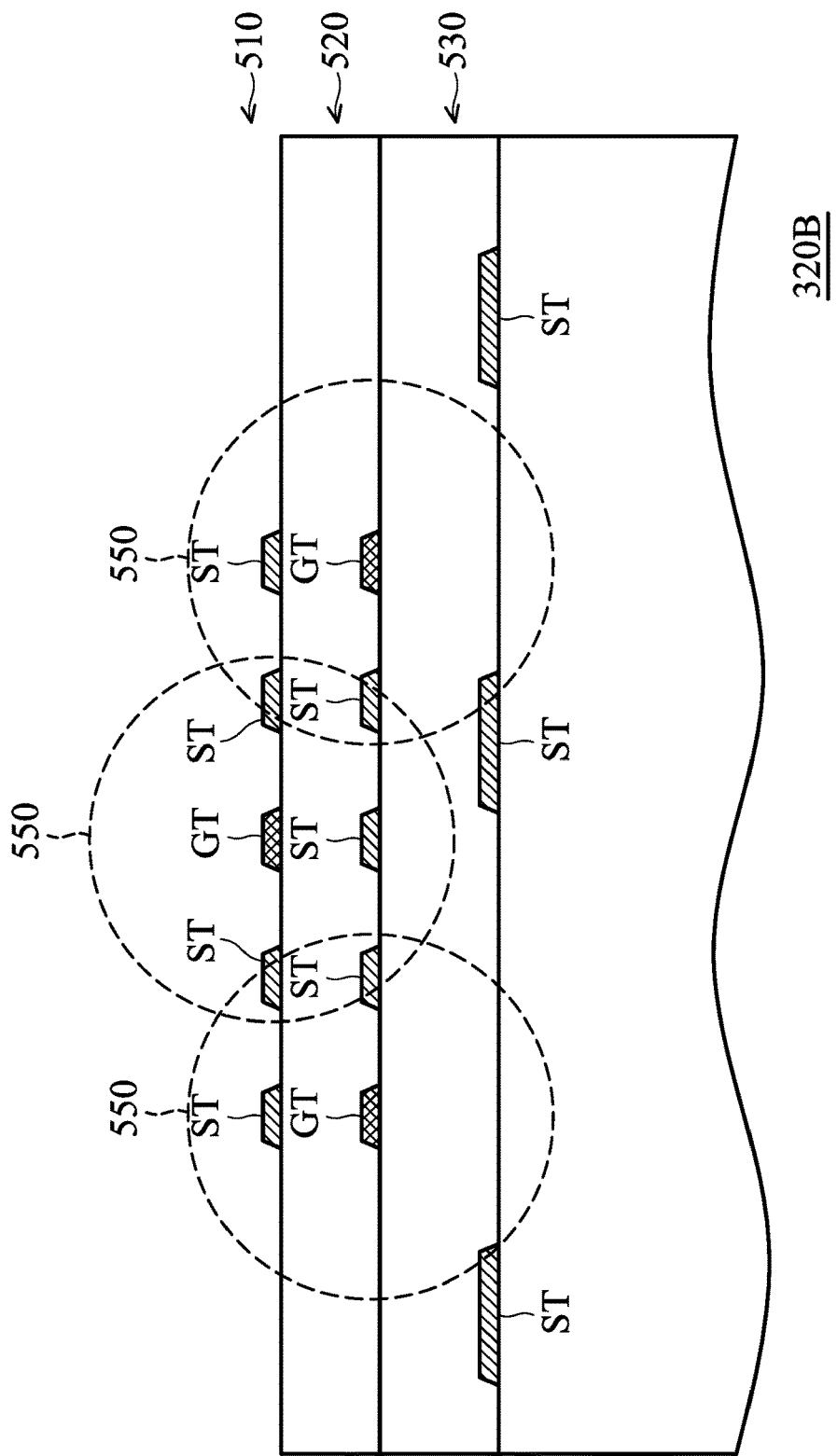
FIG. 5B shows a cross section illustrating the arrangement of the conductive traces of an exemplary PCB along line A-A' of FIG. 3 according to another embodiment of the invention.

FIG. 5B shows a cross section illustrating the arrangement of the conductive traces 340 of an exemplary PCB 320B along line A-A' of FIG. 3 according to another embodiment of the invention. Referring to FIG. 3 and FIG. 5B together, in the embodiment, the first chip 310 is operating in a high-speed mode. As described above, a portion of driving units of the first chip 310 are selected to provide the data $D_{out}$ in the high-speed mode, i.e. not all of the driving units of the first chip 310 are used to provide the data $D_{out}$. Furthermore, the unselected driving units are used to provide at least one shielding pattern. The specific shielding pattern is formed by a ground signal, a power signal or a random signal. In the embodiment, a middle conductive trace 340 in the first layer 510 of the PCB 320B functions as a guard trace GT, and other conductive traces 340 in the first layer 510 of the PCB 320B are the signal traces ST capable of transmitting the corresponding bit signals of the data $D_{out}$ to the second chip 330. Furthermore, two outermost conductive trace 340 in the second layer 520 of the PCB 320B functions as the guard traces GT, and other conductive traces 340 in the second layer 520 of the PCB 320B are the signal traces ST capable of transmitting the corresponding bit signals of the data $D_{out}$ to the second chip 330. Moreover, the conductive traces 340 in the third layer 530 of the PCB 320B are the signal traces ST capable of transmitting the corresponding bit signals of the data $D_{out}$ to the second chip 330. In the embodiment, each guard trace GT can provide a shielding range 550 for reducing interference when the data $D_{out}$ is transmitted via the signal traces ST adjacent to the guard trace GT, i.e. the guard trace GT is surrounded by the signal traces ST. Thus, crosstalk is decreased for the signal traces ST. It should be noted that the guard traces GT are separated by the signal traces ST in FIG. 5B. Furthermore, the shielding pattern transmitted by each guard trace GT can be the same or different. Compared with the traditional shielding lines, the guard traces GT of FIG. 5B will not occupy the additional area on the PCB 320B, i.e. the unused conductive traces will be used as the guard traces GT. Specifically, no additional shielding line is fixedly routed and inserted into the conductive traces 340 on the PCB 320B, thus decreasing layout size of the PCB 320B. Furthermore, the arrangement of the conductive traces 340 is determined according to the outputs of the driving units of the first chip 310 via the bumps 315, wherein the outputs of the driving units are controlled by a control circuitry of the first chip 310, e.g. the control circuitry 160 of FIG. 1. The control circuitry of the first chip 310 can modify the arrangement of the conductive traces 340 via the driving units according to actual applications. Furthermore, the guard traces GT can reduce electrical noise from affecting the signals on the PCB 320B. It should be noted that the arrangement of the conductive traces 340 in each layer of the PCB 320B can be swapped. For example, in one embodiment, two outermost conductive trace 340 in the second layer 510 of the PCB 320B could be the guard traces GT, and other conductive traces 340 in the second layer 510 of the PCB 320B could be the signal traces ST. Furthermore, a middle conductive trace 340 in the first layer 520 of the PCB 320B could be a guard trace GT, and other conductive traces 340 in the first layer 520 of the PCB 320B could be the signal traces ST. Furthermore, the number of guard traces GT is less than the number of signal traces ST in FIG. 5B.

Figure 5C:
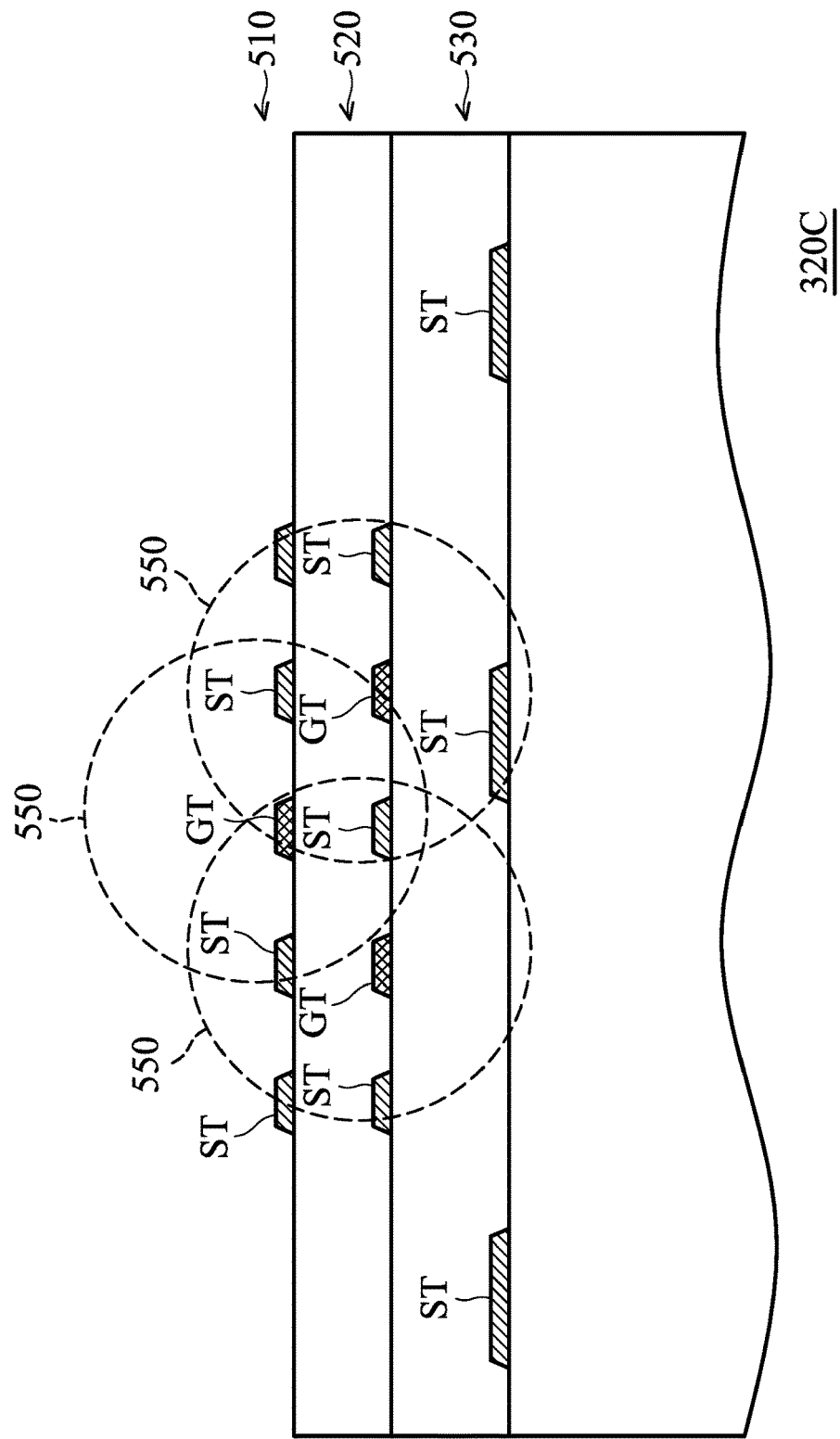
FIG. 5C shows a cross section illustrating the arrangement of the conductive traces of an exemplary PCB along line A-A' of FIG. 3 according to another embodiment of the invention.

FIG. 5C shows a cross section illustrating the arrangement of the conductive traces 340 of an exemplary PCB 320C along line A-A' of FIG. 3 according to another embodiment of the invention. Referring to FIG. 3 and FIG. 5C together, in the embodiment, the first chip 310 of FIG. 3 is operating in a high-speed mode. Compared with the embodiment of FIG. 5B, the arrangement of the conductive traces 340 in the second layer 520 on the PCB 320B in FIG. 5B is different from the arrangement of the conductive traces 340 in the second layer 520 on the PCB 320C in FIG. 5C. In FIG. 5C, a middle conductive trace 340 and the two outermost conductive trace 340 in the second layer 520 of the PCB 320B are the signal traces ST capable of transmitting the corresponding bit signals of the data $D_{out}$ to the second chip 330, and other conductive traces 340 in the second layer 520 of the PCB 320B functions as the guard traces GT. In the embodiment, each guard trace GT can provide a shielding range 550 for reducing interference when the data $D_{out}$ is transmitted via the signal traces ST adjacent to the guard trace GT, i.e. the guard trace GT is surrounded by the signal traces ST. As described above, the guard traces GT are separated by the signal traces ST. Furthermore, the shielding pattern transmitted by each guard trace GT can be the same or different. It should be noted that the arrangement of the conductive traces 340 in each layer of the PCB 320C also can be swapped. Furthermore, the number of guard traces GT is less than the number of signal traces ST in FIG. 5C.

Figure 6:
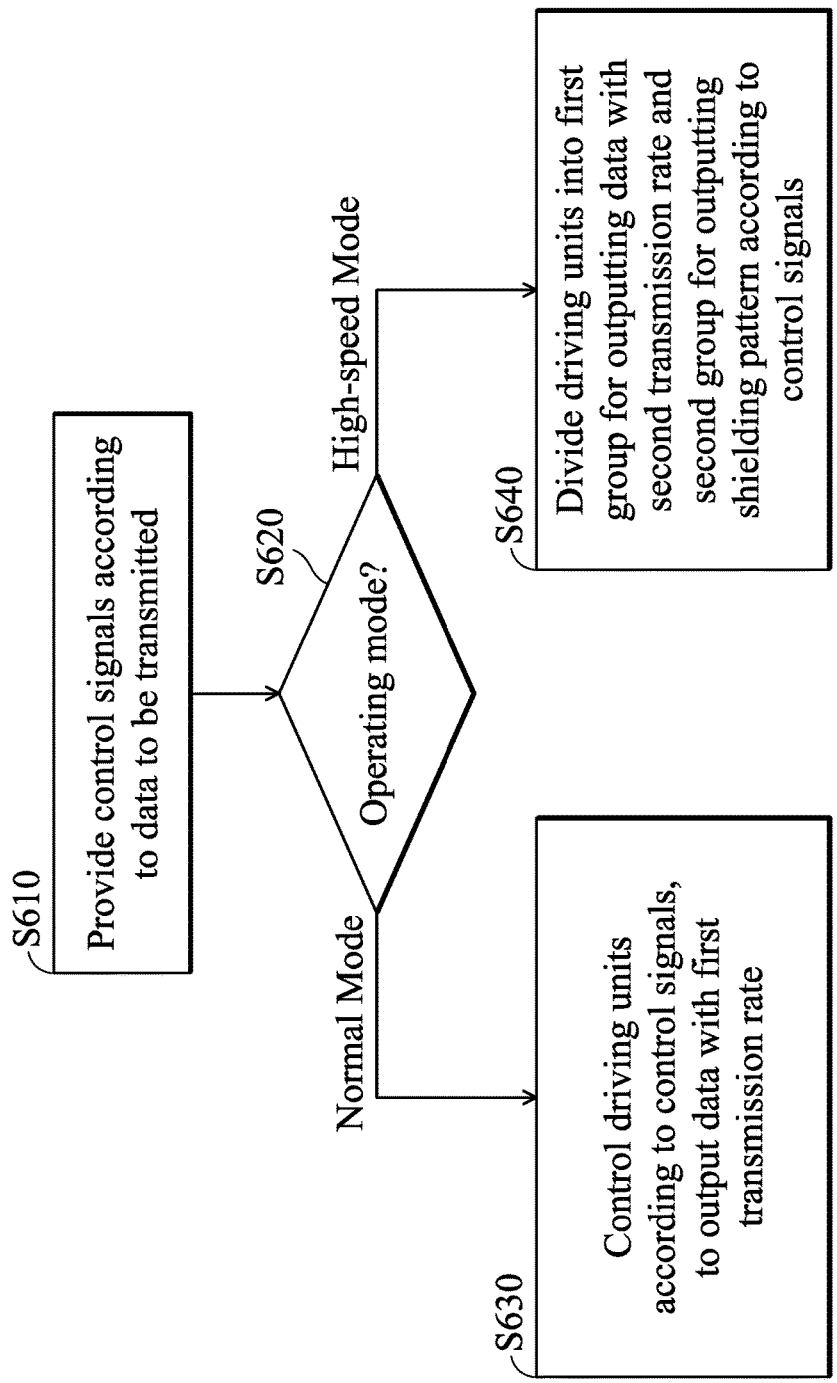
FIG. 6 shows a method for transmitting data from a first chip to a second chip via a plurality of conductive traces of a printed circuit board in an electronic device.

FIG. 6 shows a method for transmitting data from a first chip to a second chip via a plurality of conductive traces of a printed circuit board in an electronic device (e.g. 100 of FIG. 1 or 300 or FIG. 3). In the electronic device, the first chip and the second chip are mounted on the PCB. First, a control circuitry of the first chip provides a plurality of control signals according to the data to be transmitted to the second chip (step S610). Next, it is determined which mode that first chip is operating (step S620). If the first chip is operating in a normal mode, a plurality of driving units of the first chip are controlled according to the control signals, to output the data via the conductive traces of the PCB according to a first transmission rate (step S630). If the first chip is operating in a high-speed mode, the driving units of the first chip are divided into two groups according to the control signals (step S640), wherein a first group of driving units are used to output the data via the signal traces ST of the PCB according to a first transmission rate, and a second group of driving units are used to output at least one specific shielding pattern via the guard traces GT of the PCB according to a second transmission rate. The second transmission rate is higher than the first transmission rate. The specific shielding pattern is formed by a ground signal, a power signal or a random signal. In one embodiment, each guard trace GT is surrounded by the signal traces ST on the PCB. Furthermore, the guard traces GT are separated by the signal traces ST.

According to the embodiments, a control circuitry of a first chip can control the arrangement of the conductive traces between the first chip and a second chip via the driving units of the first chip to transmit the data $D_{out}$ to the second chip. In a normal mode, the conductive traces are used to provide the data $D_{out}$ to the second chip. In a high-speed mode, a portion of driving units is selected to provide the data $D_{out}$ and the remaining driving units are used to provide at least one specific shielding pattern, wherein the specific shielding pattern is formed by a ground signal, a power signal or a random signal. Furthermore, the conductive traces coupled to the selected driving units function as the signal traces ST on the PCB, and the conductive traces coupled to the remainder of the driving units function as the guard traces GT on the PCB. According to the embodiments, no shielding line is fixedly routed and inserted into the conductive traces between the first chip and the second chip on the PCB.

Furthermore, in one embodiment, no matter whether the normal mode or high-speed mode is being used, the unused conductive traces can be used as the guard traces GT so as to provide a shielding range for the adjacent signal traces ST. Therefore, no additional shielding line is fixedly routed and inserted into the signal traces ST on the PCB, thus decreasing layout size of the PCB. Moreover, the arrangement of the conductive traces is determined according to the outputs of the driving units of the first chip via the bumps or pins thereof, wherein the outputs of the driving units are controlled by the control circuitry of the first chip. The control circuitry of the first chip can modify the arrangement of the conductive traces via the driving units according to actual applications, thereby increasing design flexibility.

Figure 7:
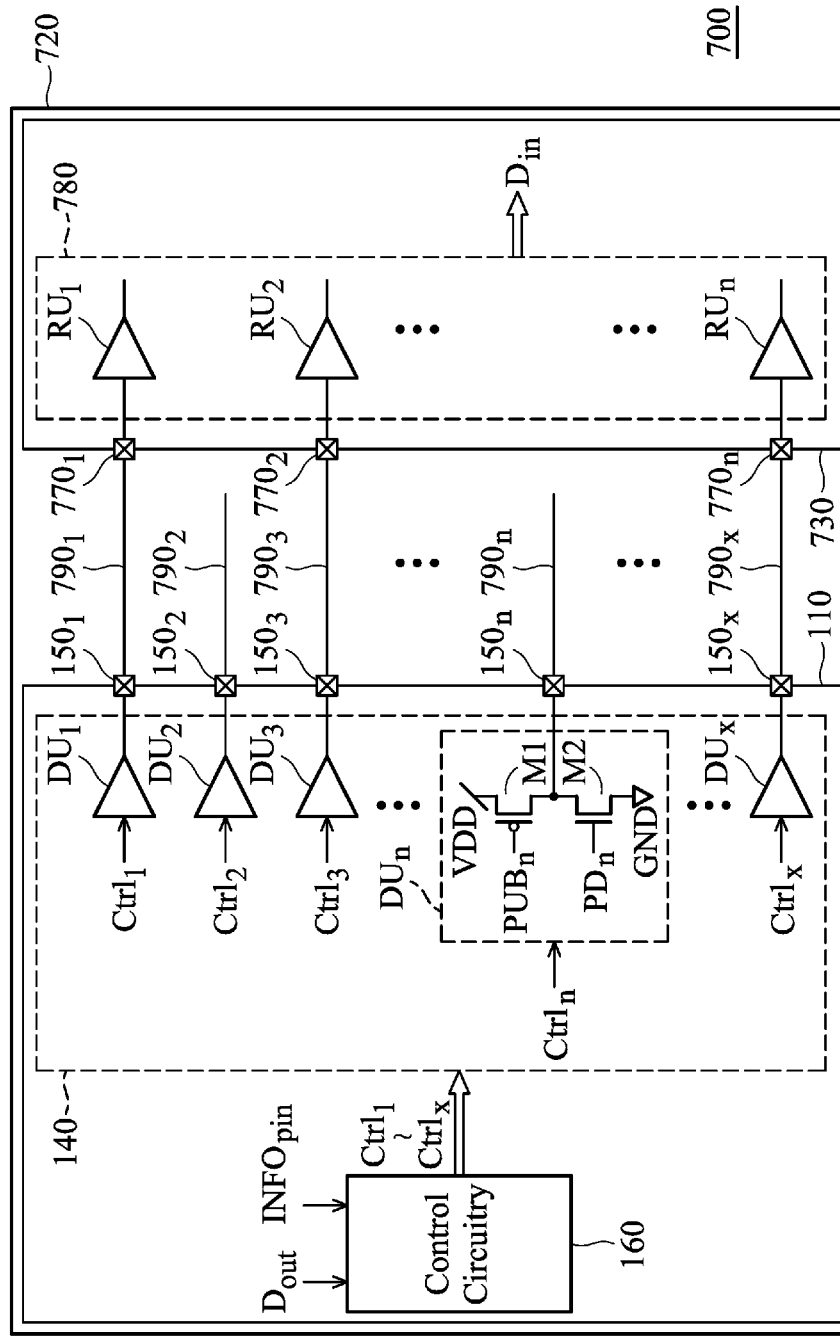
FIG. 7 shows an electronic device according to another embodiment of the invention.

FIG. 7 shows an electronic device 700 according to another embodiment of the invention. The electronic device 700 comprises a first chip 110, a PCB 720, and a second chip 730, wherein the first chip 110 and the second chip 730 are mounted on the PCB 720. In the embodiment, the first chip 110 is operating in a high-speed mode, and the pin information $INFO_{pin}$ indicates that the second chip 730 is a low power double data rate type III (LPDDR3) memory. In the high-speed mode, the first chip 110 can transmit data to the second chip 730 with a double data rate via a plurality of conductive traces $790_1$-$790_x$ of the PCB 720. In general, the pin number (i.e. the number of pins) of the LPDDR3 memory is less than the pin number of the DDR3. As described above, the first chip 110 comprises an output module 140, a plurality of pins $150_1$-$150_x$, and a control circuitry 160. The control circuitry receives data $D_{out}$ to be provided to the second chip 730 and pin information $INFO_{pin}$ regarding the pin configuration of the second chip 730, and provides a plurality of control signals $Ctrl_1$-$Ctrl_x$ to the second chip 130 according to the data $D_{out}$ and the pin information $INFO_{pin}$. In some embodiments, the data $D_{out}$ and the pin information $INFO_{pin}$ are obtained from a circuit (e.g. a memory, a processor or other functional circuitry) of the first chip 110 or a device outside the first chip 110. The output module 140 comprises a plurality of driving units $DU_1$-$Du_x$, wherein an output of each driving unit is coupled to the corresponding pin of the first chip 110. In the embodiment, each of the driving units $DU_1$-$DU_x$ has the same circuitry and structure. Furthermore, according to the corresponding control signal, each driving unit can selectively provide 1-bit data of the data $D_{out}$ or a constant voltage to the corresponding conductive trace of the PCB 720. For example, according to the control signal $Ctrl_1$, the driving unit $DU_1$ can provide 1-bit data of the data $D_{out}$ to the conductive trace $790_1$ of the PCB 720. Furthermore, according to the control signal $Ctrl_n$, the driving unit $DU_n$ can provide a constant voltage to the conductive trace $790_n$ of the PCB 720.

In FIG. 7, the second chip 730 comprises an input module 780 and a plurality of pins $770_1$-$770_n$, wherein the input module 780 comprises a plurality of receiving unit $RU_1$-$RU_n$. Each of the receiving units $RU_1$-$RU_n$ is coupled to the corresponding conductive trace of the PCB 720 via the corresponding pin of the second chip 730, and is used to receive a signal transmitted in the corresponding conductive trace. For example, the receiving unit $RU_1$ is coupled to the conductive trace $790_1$ of the PCB 720 via the pin $770_1$ of the second chip 730, and the receiving unit $RU_2$ is coupled to the conductive trace $790_3$ of the PCB 720 via the pin $770_2$ of the second chip 730. It should be noted that the amount of the pins $770_1$-$770_n$ of the second chip 730 is less than the amount of the pins $150_1$-$150_x$ of the first chip 110, i.e. n<x. Thus, the amount of the receiving units $RU_1$-$RU_n$ of the second chip 730 is less than the amount of the driving units $DU_1$-$DU_x$ of the first chip 110. After receiving the signals, the input module 780 is capable of provide an input data $D_{in}$ according to the received signals for subsequent processing.

Figure 8:
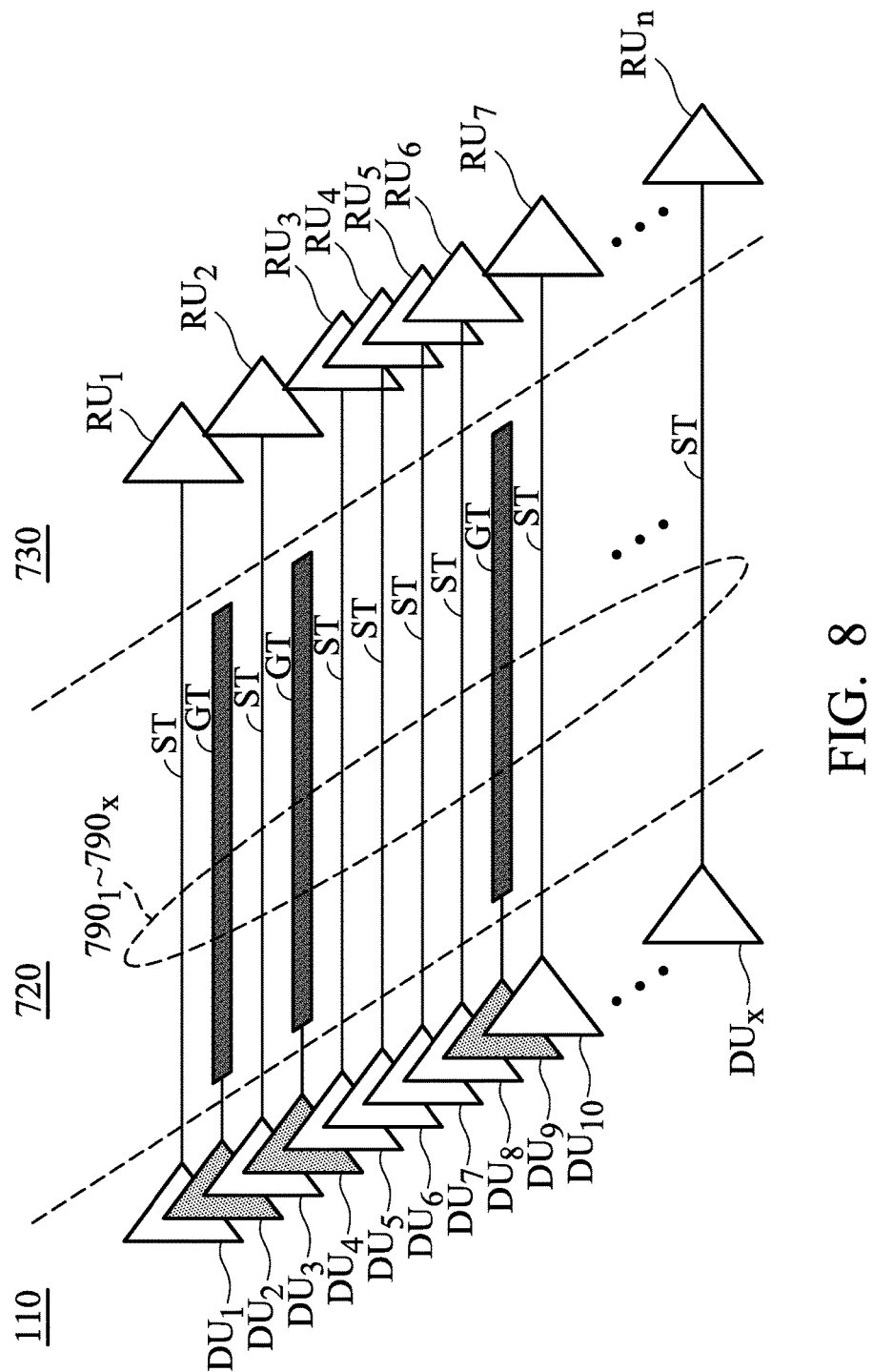
FIG. 8 shows a schematic illustrating the conductive traces between the first chip and the second chip on the PCB of FIG. 7 according to an embodiment of the invention.

FIG. 8 shows a schematic illustrating the conductive traces $790_1$-$790_x$ between the first chip 110 and the second chip 730 on the PCB 720 of FIG. 7 according to an embodiment of the invention. In order to simplify the description, the pins of the first chip 110 and the second chip 730 will be omitted in FIG. 8. In the embodiment, the conductive traces $790_1$-$790_x$ are disposed on the same layer of the PCB 720, e.g. a top layer of the PCB 720. In some embodiments, the conductive traces $790_1$-$790_x$ may be disposed on different layers of the PCB 120. As described above, according to the control signals $Ctrl_1$-$Ctrl_x$, a portion of driving units are selected from the driving units $DU_1$-$DU_x$ to provide the data $D_{out}$, i.e. not all of the driving units $DU_1$-$DU_x$ are used to provide the data $D_{out}$. Furthermore, the unselected driving units are used to provide at least one constant voltage, and the constant voltage may be a grounding voltage, a power voltage VDD or an intermediate voltage between the grounding voltage (GND) and the power voltage VDD, such as half of the power voltage VDD (e.g. VDD/2), one-third of the power voltage VDD (e.g. VDD/3), a quarter of the power voltage VDD (e.g. VDD/4), and so on. In some embodiments, the unselected driving units are used to provide various constant voltages. It should be noted that the constant voltages are determined according to actual applications. Furthermore, according to the pin information $INFO_{pin}$ of the second chip 730, the driving units $DU_1$, $DU_3$, $DU_{5-8}$, $DU_{10}$, ..., $DU_x$ are selected to provide the data $D_{out}$, thereby the conductive traces of the PCB 720 corresponding to the selected driving units function as the signal traces ST for transmitting the data $D_{out}$ to the second chip 730. Moreover, the unselected driving units $DU_2$, $DU_4$ and $DU_9$ are used to provide at least one constant voltage, thereby the conductive traces corresponding to the unselected driving units function as the guard traces GT for reducing crosstalk when the data $D_{out}$ is transmitted via the signal traces ST. It should be noted that the conductive traces of the PCB 720 corresponding to the selected driving units $DU_1$, $DU_3$, $DU_{5-8}$, $DU_{10}$, ..., and $DU_x$ are electrically connected to the second chip 730 on the PCB 720. Moreover, the conductive traces of the PCB 720 corresponding to the unselected driving units $DU_2$, $DU_4$ and $DU_9$ are electrically separated from the second chip 730 on the PCB 720, i.e. the conductive traces of the PCB 720 corresponding to the unselected driving units $DU_2$, $DU_4$ and $DU_9$ are not coupled to the second chip 730. Furthermore, the guard traces GT are separated by the signal traces ST in FIG. 8. Furthermore, the constant voltage transmitted in each guard trace GT can be the same or different. It should be noted that the number of guard traces GT is less than the number of signal traces ST in FIG. 8. In some embodiments, each guard trace GT is surrounded by the signal traces ST on the PCB 720. Furthermore, the guard traces GT are separated by the signal traces ST. In some embodiments, the signal traces ST used to transmit the critical signals, such as a chip select (CS) signal, and a command/address (CA) signal, are separated from each other by the guard traces GT. In some embodiments, the PCB 720 further comprises other devices capable of providing the constant voltages to the corresponding guard traces GT.

Traditionally, after obtaining system specification and requisition, a plurality of shielding lines are implemented on a PCB in order to decrease crosstalk problem, wherein the shielding lines are fixedly routed on the PCB and are also inserted into the conductive traces between the devices on the PCB. In general, the shielding lines are coupled to a ground of the PCB. Compared with the traditional shielding lines, the guard traces GT of FIG. 8 will not occupy the additional area on the PCB, i.e. the guard traces GT are the unused signal traces existing on the PCB 720. Specifically, no additional shielding line is fixedly routed and inserted into the conductive traces on the PCB 720, thus decreasing the layout size of the PCB 720. Furthermore, the arrangement of the conductive traces $790_1$-$390_x$ is determined according to the pin information $INFO_{pin}$ regarding the second chip 730. The outputs of the driving units $DU_1$-$DU_x$ are controlled by the control circuitry 160 of the first chip 110, e.g. the control circuitry 160 of FIG. 1, according to the data $D_{out}$ and the pin information $INFO_{pin}$ of the second chip 730. The guard traces GT can reduce electrical noise from affecting the signals between the first chip 110 and the second chip 730 on the PCB 720, e.g. avoiding the signal current loops formed in the conductive traces on the PCB 720. Furthermore, the interconnection between the first chip 110 and the second chip 730 can be planned in advance, and the layout of signals of the interconnection can be minimized due to no additional shielding lines. Furthermore, the development cost of the layout is also decreased.

Figure 9:
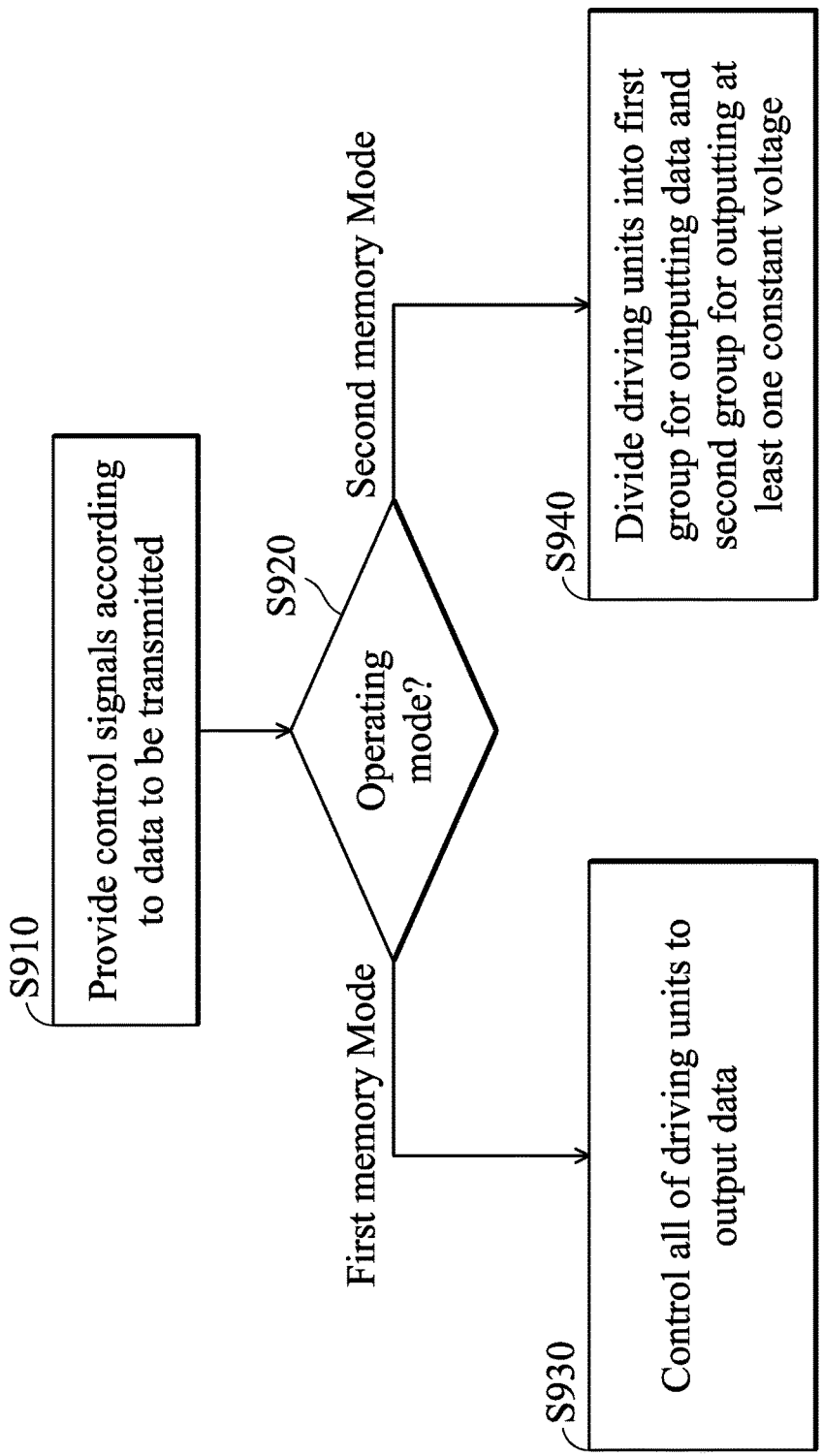
FIG. 9 shows a method for transmitting data from a first chip to a second chip via a plurality of conductive traces of a printed circuit board in an electronic device.

FIG. 9 shows a method for transmitting data from a first chip to a second chip via a plurality of conductive traces of a printed circuit board in an electronic device. In the electronic device, the first chip and the second chip are mounted on the PCB. First, a control circuitry of the first chip provides a plurality of control signals according to the data to be transmitted to the second chip and the pin information $INFO_{pin}$ (step S910). Next, it is determined which mode that first chip is operating according to the pin information $INFO_{pin}$ (step S920). If the first chip is operating in a first memory mode, a plurality of driving units of the first chip are controlled according to the control signals, to output the data via the conductive traces of the PCB (step S930). If the first chip is operating in a second memory mode, the driving units of the first chip are divided into two groups according to the control signals (step S940), wherein a first group of driving units are used to output the data via the signal traces ST of the PCB, and a second group of driving units are used to output at least one constant voltage via the guard traces GT of the PCB. As described above, the guard traces GT and the signal traces ST are coupled to the first chip, wherein the guard traces GT are electrically separated from the second chip, and the signal traces ST are electrically connected to the second chip. Furthermore, the constant voltage transmitted in each guard trace GT can be the same or different. Moreover, the guard traces GT are separated by the signal traces ST. In some embodiments, each signal trace ST used to transmit the critical signal is surrounded by the guard traces GT.

According to the embodiments, a control circuitry of a first chip can control the arrangement of the conductive traces between the first chip and a second chip via the driving units of the first chip to transmit the data $D_{out}$ to the second chip. In a first memory mode, the whole driving units are used to provide the data $D_{out}$ to the second chip. In a second memory mode, a portion of driving units is selected to provide the data $D_{out}$ and the remaining driving units are used to provide at least one constant voltage. Furthermore, the conductive traces coupled to the selected driving units function as the signal traces ST on the PCB, wherein the signal traces ST are electrically connected to the second chip. The conductive traces coupled to the remainder of the driving units function as the guard traces GT on the PCB, wherein the guard traces GT are electrically separated from the second chip. According to the embodiments, no shielding line is fixedly routed and inserted into the conductive traces between the first chip and the second chip on the PCB.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit (IC), comprising:
a control circuitry configured to provide a plurality of control signals according to data to be transmitted from the IC to a second IC and pin information regarding the second IC, the pin information comprising information regarding a pin configuration of the second IC;
a plurality of pins coupled to a plurality of conductive traces of a printed circuit board (PCB); and
a plurality of driving units coupled to the conductive traces of the PCB via the plurality of pins, wherein based on at least the pin information of the second IC:
a first subset of the plurality of driving units is selected to provide the data to the second IC via a corresponding first subset of the plurality of pins and a corresponding first subset of the plurality of conductive traces of the PCB, and
a second subset of the plurality of driving units is not selected to provide the data to the second IC, and the second subset of the plurality of driving units are configured to provide at least one constant voltage to a corresponding second subset of the plurality of conductive traces of the PCB via a corresponding second subset of the plurality of pins,
wherein a pin number of the IC is greater than a pin number of the second IC.

2. The integrated circuit as claimed in claim 1, wherein the first subset of the plurality of conductive traces is electrically connected to the second IC, and the second subset of the plurality of conductive traces is electrically separated from the second IC.

3. The integrated circuit as claimed in claim 1, wherein each conductive trace of the first subset of the plurality of conductive traces coupled to the first subset of the plurality of driving units is a signal trace, and each conductive trace of the second subset of the plurality of conductive traces coupled to the second subset of the plurality of driving units is a guard trace.

4. The integrated circuit as claimed in claim 1, wherein each conductive trace of the second subset of the plurality of conductive traces coupled to the second subset of the plurality of driving units is surrounded by the first subset of the plurality of conductive traces coupled to the first subset of the plurality of driving units.

5. The integrated circuit as claimed in claim 1, wherein the at least one constant voltage is a grounding voltage, a power voltage or an intermediate voltage between the grounding voltage and the power voltage.

6. An integrated circuit, comprising:
a control circuitry, providing a plurality of control signals according to data to be transmitted from a first chip to a memory device of a printed circuit board (PCB) and pin information regarding the memory device;
a plurality of pins coupled to a plurality of conductive traces of the PCB; and
a plurality of driving units coupled to the conductive traces of the PCB via the corresponding pins,
wherein when the pin information indicates that the memory device is a first memory, the control signals control the driving units to provide the data to the conductive traces of the PCB via the pins,
wherein when the pin information indicates that the memory device is a second memory, the control signals control a portion of the driving units to provide the data to the corresponding conductive traces of the PCB via the corresponding pins, and the control signals control an other portion of the driving units to provide at least one constant voltage to the corresponding conductive traces of the PCB via the corresponding pins, wherein a pin number of the first memory is greater than a pin number of the second memory.

7. The integrated circuit as claimed in claim 6, wherein the conductive traces corresponding to the portion of the driving units are electrically connected to the second memory, and the conductive traces corresponding to the other portion of the driving units are electrically separated from the second memory.

8. The integrated circuit as claimed in claim 6, wherein each of the conductive traces corresponding to the portion of the driving units is a signal trace, and each of the conductive traces corresponding to the other portion of the driving units is a guard trace.

9. The integrated circuit as claimed in claim 6, wherein each of the conductive traces corresponding to the other portion of the driving units is surrounded by the conductive traces corresponding to the portion of the driving units.

10. The integrated circuit as claimed in claim 6, wherein the at least one constant voltage is a grounding voltage, a power voltage or an intermediate voltage between the grounding voltage and the power voltage.

11. The integrated circuit as claimed in claim 6, wherein the first memory is a double data rate type III (DDR3) memory, and the second memory is a low power double data rate type III (LPDDR3) memory.

12. An electronic device, comprising:
a printed circuit board (PCB), comprising a plurality of conductive traces, wherein the conductive traces are divided into a plurality of first conductive traces and a plurality of second conductive traces;
a first chip mounted on the PCB; and
a second chip mounted on the PCB and coupled to the first chip via the first conductive traces;
wherein the first chip comprises:
a plurality of pins coupled to the first and second conductive traces of the PCB;
a control circuitry configured to provide a plurality of control signals according to data to be transmitted from the first chip to the second chip; and
a plurality of driving units coupled to the plurality of pins, the plurality of driving units comprising a first subset of driving units and a second subset of driving units, the first subset of driving units configured to provide the data to the second chip via the first conductive traces of the PCB, and the second subset of driving units configured to provide at least one constant voltage to the PCB via the second conductive traces of the PCB,
wherein the first conductive traces corresponding to the first subset of driving units are electrically connected to the first chip and the second chip, and the second conductive traces corresponding to the second subset of driving units are electrically coupled to the first chip and do not couple signals from any other chip including the second chip.

13. The electronic device as claimed in claim 12, wherein each of the first conductive traces is a signal trace, and each of the second conductive traces is a guard trace.

14. The electronic device as claimed in claim 12, wherein each of the second conductive traces is surrounded by the first conductive traces on the PCB.

15. The electronic device as claimed in claim 12, wherein the second conductive traces are separated by the first conductive traces on the PCB.

16. The electronic device as claimed in claim 12, wherein the at least one constant voltage is a grounding voltage, a power voltage or an intermediate voltage between the grounding voltage and the power voltage.

17. A method for transmitting data from a first chip to a second chip via a plurality of first conductive traces of a printed circuit board (PCB) in an electronic device, wherein the first chip and the second chip are mounted on the PCB, comprising:
providing, by the first chip, a plurality of control signals according to the data to be transmitted to the second chip and pin information regarding the second chip, the pin information comprising information regarding a pin configuration of the second chip;
based on at least the pin information of the second chip:
controlling, by the first chip, a plurality of first driving units to provide the data to the second chip via the plurality of first conductive traces of the PCB, and
controlling, by the first chip, a plurality of second driving units to provide at least one constant voltage to the PCB via a plurality of second conductive traces of the PCB,
wherein a pin number of the first chip is greater than a pin number of the second chip.

18. The method as claimed in claim 17, wherein each of the first conductive traces is a signal trace, and each of the second conductive traces is a guard trace, and the at least one constant voltage is a grounding voltage, a power voltage or an intermediate voltage between the grounding voltage and the power voltage.

19. The method as claimed in claim 17, wherein the second conductive traces are separated by the first conductive traces on the PCB.

20. The method as claimed in claim 17, wherein the first conductive traces are electrically connected to the second chip on the PCB, the second conductive traces do not couple signals from the second chip on the PCB, and each of the second conductive traces is surrounded by the first conductive traces on the PCB.

* * * * *